(12) United States Patent
Park et al.

(10) Patent No.: US 12,087,624 B2
(45) Date of Patent: Sep. 10, 2024

(54) BEOL TIP-TO-TIP SHORTING AND TIME DEPENDENT DIELECTRIC BREAKDOWN

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Shatin (HK); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 17/481,198

(22) Filed: Sep. 21, 2021

(65) Prior Publication Data

US 2023/0090755 A1 Mar. 23, 2023

(51) Int. Cl.
*H01L 21/768* (2006.01)
*H01L 23/528* (2006.01)
*H01L 23/532* (2006.01)

(52) U.S. Cl.
CPC .. *H01L 21/76846* (2013.01); *H01L 21/76831* (2013.01); *H01L 21/76849* (2013.01); *H01L 21/76865* (2013.01); *H01L 21/76883* (2013.01); *H01L 23/5283* (2013.01); *H01L 23/53295* (2013.01); *H01L 23/53238* (2013.01)

(58) Field of Classification Search
CPC ......... H01L 21/76834; H01L 21/76849; H01L 21/76846; H01L 21/76831; H01L 21/76865; H01L 21/76883; H01L 23/53238; H01L 23/5283; H01L 23/53295; H01L 23/538
See application file for complete search history.

(56) References Cited

U.S. PATENT DOCUMENTS

| | | | |
|---|---|---|---|
| 6,790,778 B1* | 9/2004 | Cheng | H01L 21/76883 438/653 |
| 7,443,029 B2* | 10/2008 | Lin | H01L 21/76831 257/E21.582 |
| 8,232,200 B1* | 7/2012 | Oh | H01L 21/76844 438/626 |
| 9,275,889 B2 | 3/2016 | Kim | |
| 9,589,847 B1 | 3/2017 | Chi | |
| 10,020,223 B1 | 7/2018 | Anderson | |
| 10,181,421 B1 | 1/2019 | Ryan | |

(Continued)

OTHER PUBLICATIONS

Disclosed Anonymously et al., "New Self-Aligned Contact for 2D Isolation", ip.com Prior Art Database Technical Disclosure, IPCOM000258409D, May 8, 2019, pp. 1-8.

(Continued)

*Primary Examiner* — Jaehwan Oh
*Assistant Examiner* — John M Parker
(74) *Attorney, Agent, or Firm* — Randy Tejeda

(57) ABSTRACT

A dielectric layer is located on top of and in contact with a substrate. A conductive line located within the dialectic layer. A barrier layer on top of an in contact with the dielectric layer. The barrier layer is below the conductive line. A liner layer on top of and in contact with the barrier layer and below and in contact with the conductive line. A metal liner on top of and in contact with the conductive line. A capping layer on top of and in contact with the dielectric layer, the barrier layer, the liner layer, and the metal liner.

9 Claims, 4 Drawing Sheets

(56) References Cited

U.S. PATENT DOCUMENTS

| | | |
|---|---|---|
| 10,504,834 B2 | 12/2019 | Cheng |
| 10,991,618 B2 | 4/2021 | Yang |
| 10,998,263 B2 | 5/2021 | Liang |
| 11,011,416 B2 | 5/2021 | Jisong |
| 2004/0266167 A1* | 12/2004 | Dubin ............... H01L 21/76843 |
| | | 257/E21.586 |
| 2019/0148224 A1* | 5/2019 | Kuroda ............ H01L 21/76849 |
| | | 438/653 |
| 2019/0164823 A1* | 5/2019 | Wang ............... H01L 21/76847 |
| 2020/0105664 A1* | 4/2020 | Han .................. H01L 21/76829 |
| 2020/0388533 A1* | 12/2020 | You .................. H01L 21/76877 |
| 2021/0005445 A1 | 1/2021 | Zhang |
| 2021/0287988 A1* | 9/2021 | Xie .................. H01L 21/76852 |
| 2022/0093455 A1* | 3/2022 | Su ....................... H01L 21/0338 |
| 2022/0157710 A1* | 5/2022 | Li .................... H01L 21/76831 |
| 2022/0415817 A1* | 12/2022 | Lin .................. H01L 21/76811 |
| 2023/0080438 A1* | 3/2023 | Park ................. H01L 21/76816 |
| | | 257/750 |

OTHER PUBLICATIONS

Disclosed Anonymously et al., "Structure and Method for Critical Line End and Tip-to-Tip Space Patterning", ip.com Prior Art Database Technical Disclosure, IPCOM000249086D, Feb. 3, 2017, pp. 1-6.

\* cited by examiner

BEOL TIP-TO-TIP SHORTING AND TIME DEPENDENT DIELECTRIC BREAKDOWN

BACKGROUND OF THE INVENTION

The present invention relates generally to the field of semiconductor device manufacture and more particularly to improving back end of line (BEOL) tip-to-tip shorting and time dependent dielectric breakdown.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

The BEOL is the second portion of the IC fabrication process. Here, the individual pieces, including but not limited to transistors, capacitors, resistors, etc., are interconnect on the wafer. The BEOL part of fabrication stage contacts, interconnect wires, vias and dielectric structures are formed.

SUMMARY

Embodiments of the present invention provide for a semiconductor structure. In an embodiment, a dielectric layer is located on top of and in contact with a substrate. A conductive line located within the dialectic layer. A barrier layer on top of an in contact with the dielectric layer. The barrier layer is below the conductive line. A liner layer on top of and in contact with the barrier layer and below and in contact with the conductive line. A metal liner on top of and in contact with the conductive line. A capping layer on top of and in contact with the dielectric layer, the barrier layer, the liner layer, and the metal liner.

Embodiments of the present invention provide for a method of forming a semiconductor structure. In an embodiment, a dielectric layer is deposited on top of a substrate. One or more trenches are etched within the dielectric layer. A barrier layer is deposited within the one or more trenches on top of and in contact with the dielectric layer. A liner layer is deposited within the one or more trenches on top of and in contact with the barrier layer. A metal layer is deposited within the one or more trenches on top of and in contact with the liner layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
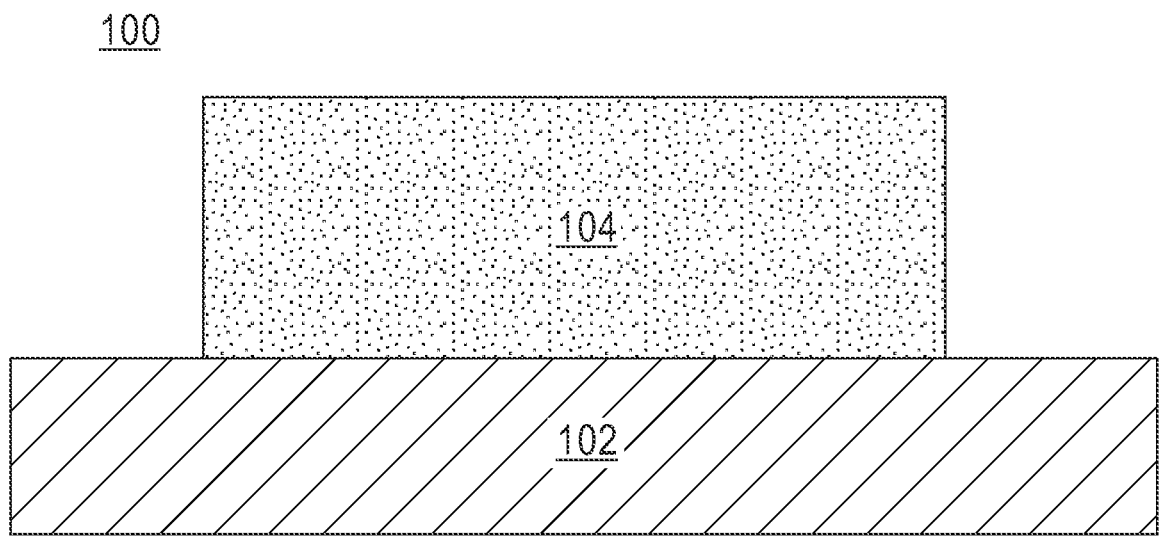
FIG. 1 depicts a cross-sectional view of a semiconductor structure with a first low-k dielectric layer deposited on a substrate in accordance with a first embodiment of the present invention.

Embodiments of the present invention recognize that aggressive metal pitch and tip-to-tip (T2T) scaling increases T2T shorting risk and/or degrades time-dependent dielectric breakdown (TDDB). Embodiments of the present invention recognize that relaxed pitch and/or T2T has an area penalty.

Embodiments of the present invention provide for reduced T2T shorting risk in aggressive T2T configurations. Embodiments of the present invention improve side-to-side (S2S) and T2T TDDB. Embodiments of the present invention provide for a recess barrier metal and liner selectively to Cu, other metal materials, and low-k dielectric layers. Embodiments of the present invention provide for divot fill with SiCN among other materials to effectively increase S2S and T2T distance by 2× liner and barrier thickness.

It should be noted, embodiments of the present invention are described and shown for simplicity in a T2T cross-section. However, embodiments of the present invention can apply to S2S cross-section and have the same benefits.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

FIGS. 1-7 depict a structure and method of improving back end of line (BEOL) tip-to-tip shorting and time dependent dielectric breakdown, in accordance with a first embodiment of the invention.

FIG. 1 depicts a cross-sectional view of a semiconductor structure 100 with a first low-k dielectric layer 104 deposited on a substrate 102 in accordance with a first embodiment of the present invention. As depicted in FIG. 1, a first low-k dielectric layer 104 is deposited upon a planarized substrate 102. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, substrate 102 may be a level of interconnect wiring. For example, modern semiconductor chips may have fifteen or more levels of interconnect wiring, labeled M1-M15, so if this structure was to be used at the M2 metal level, in other words M2 metal level as substrate 102, then the M1 metal level would be located below it. In an embodiment, the first low-k dielectric layer 104 may be any insulator having a dielectric constant of less than silicon dioxide, i.e., less than about 4.0. In an alternative embodiment, the first low-k dielectric layer 104 may be any insulator having a dielectric constant of less than 3.5. In an embodiment, the first low-k dielectric layer 104 may range from 50 nm to 150 nm in thickness but is not limited to said thickness. In an embodiment, the first low-k dielectric layer 104 may be deposited and formed using known metal and dielectric material deposition, planarization (optional), and etch processes for semiconductor manufacture.

Figure 2:
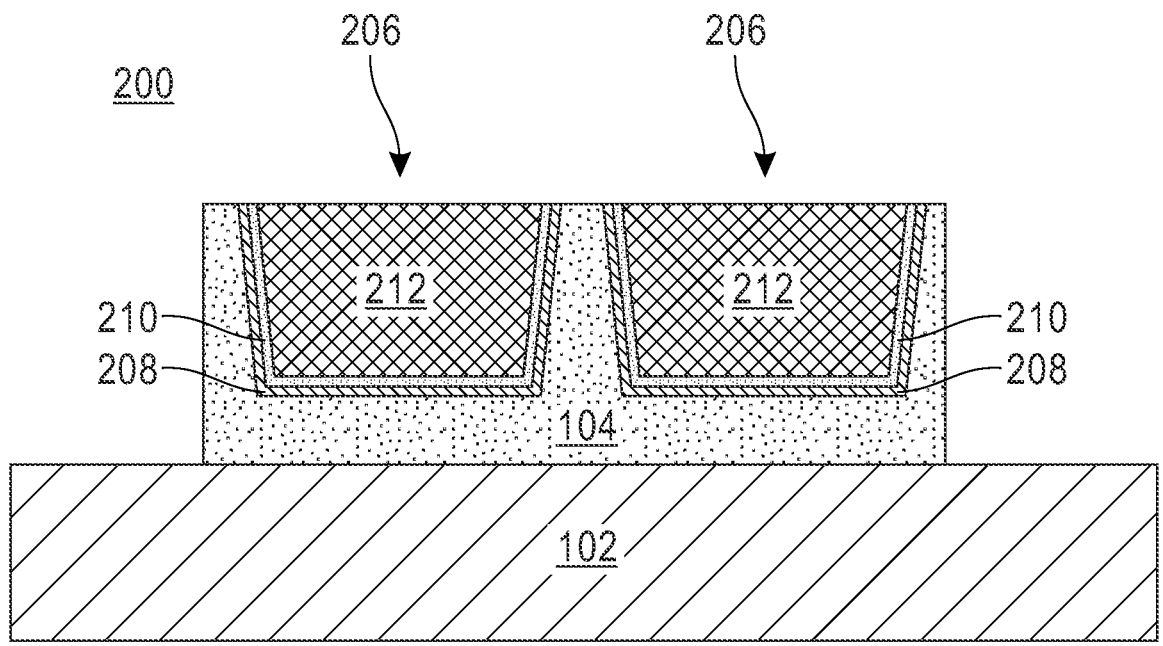
FIG. 2 depicts a cross-sectional view of the semiconductor structure with two trenches etched in the first low-k dielectric layer along with barrier layer, liner layer, and metal layer deposition within the trenches in accordance with a first embodiment of the present invention.

FIG. 2 depicts a cross-sectional view of the semiconductor structure 200 with two trenches etched in the first low-k dielectric layer 104 along with barrier layer 208, liner layer 210, and metal layer 212 deposition within the trenches 206 in accordance with a first embodiment of the present invention. As depicted, FIG. 2 shows first low-k dielectric layer 104 etched to form trenches 206. In an embodiment, two trenches are formed. In an alternative embodiment, any number of trenches may be formed. In an embodiment, a barrier layer 208 is deposited in the trenches 206 on top of the first low-k dielectric layer 104 via sputtering, ALD, CVD, or any other process known in the art. In an embodiment, barrier layer 208 may be TaN, Ta, TiN, WN, MnN, or any other material known in the art. In an embodiment, barrier layer 208 may range in thickness from 0.5 nm to 5 nm but is not limited to said thickness. In an embodiment, a liner layer 210 is deposited on top of the barrier layer 208 via sputtering or any other process known in the art. In an embodiment, barrier layer 208 is Ru, Co, or any other material known in the art. In an embodiment, barrier layer 208 may be deposited using sputtering, CVD, ALD, or any other process known in the art. In an embodiment, a liner layer 210 may range in thickness from 0.5 nm to 5 nm but is not limited to said thickness. In an embodiment, a metal layer 212 is formed within trenches 206 on top of the liner layer 210 and at least to the height of the remaining first low-k dielectric layer 104. In an embodiment, the metal layer 212 is deposited using electroplating (ECP), CVD, ALD, or any other process known in the art. In an embodiment, metal layer 212 may be Cu, Ru, W, Mo, Jr, Rh, or any material known in the art. In an embodiment, metal layer 212, liner layer 210, barrier layer 208 and/or first low-k dielectric layer 104 are leveled and cleaned using chemical mechanical polishing (CMP).

Figure 3:
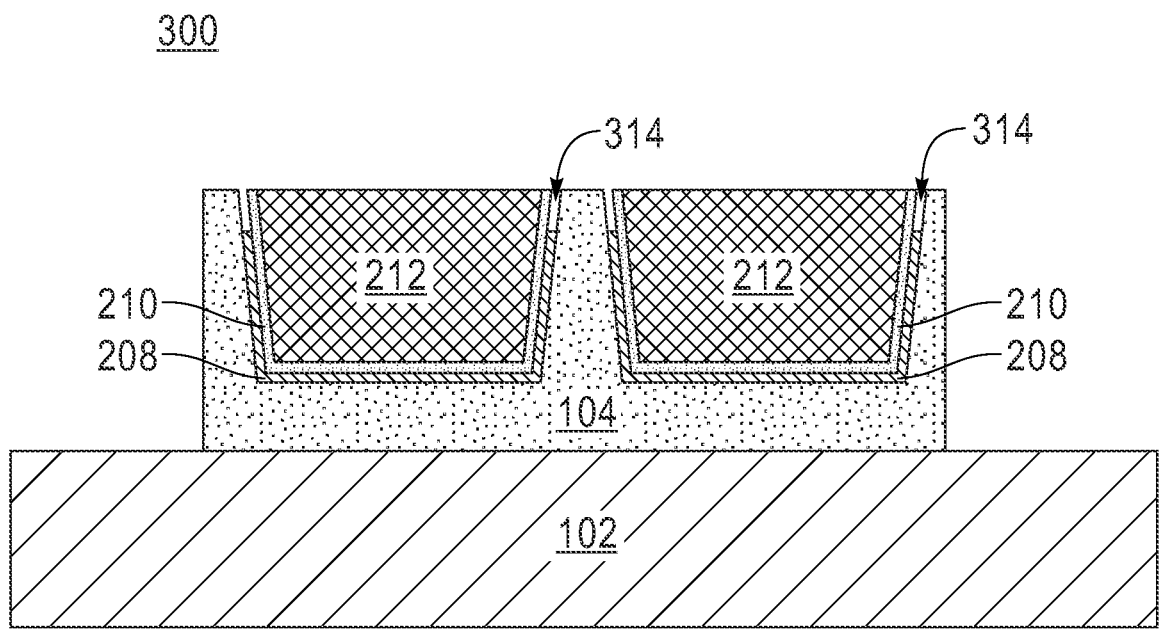
FIG. 3 depicts a cross-sectional view of the semiconductor structure after selective removal of part of the barrier layer in accordance with a first embodiment of the present invention.

FIG. 3 depicts a cross-sectional view of the semiconductor structure 300 after selective removal of part of the barrier layer 208 in accordance with a first embodiment of the present invention. As depicted, FIG. 3 includes selective removal of barrier layer 208 by a depth of 3-10 nm on both sides of the liner layer 210 to create gap 314. Gap 314 can be found on both sides of liner layer 210 on either side of metal layer 212. In an embodiment, the barrier layer 208 may be removed using any known removal technique known in the art, such as, for example, wet etching, dry etching, reactive ion etching or any combination thereof.

Figure 4:
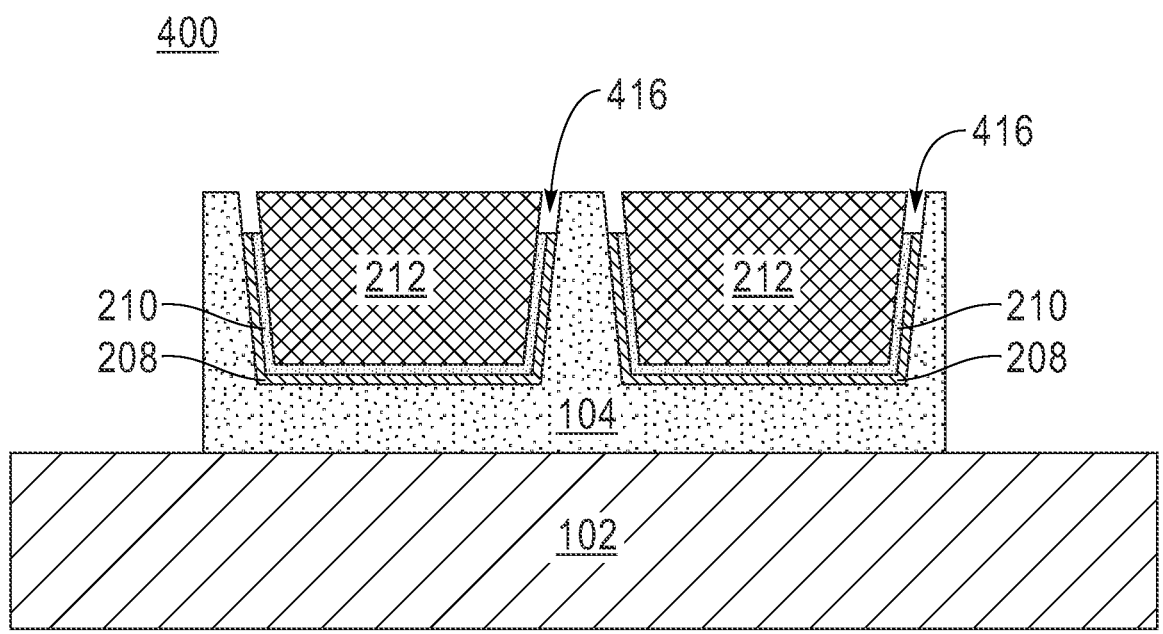
FIG. 4 depicts a cross-sectional view of the semiconductor structure after selective removal of part of the liner layer in accordance with a first embodiment of the present invention.

FIG. 4 depicts a cross-sectional view of the semiconductor structure 400 after selective removal of part of the liner layer 210 in accordance with a first embodiment of the present invention. As depicted, FIG. 4 includes selective removal of the liner layer 210 by a depth of 3-10 nm on both sides of the metal layer 212 to create gap 416 but is not limited to said depth. Gap 416 can be found on both sides of metal layer 212 and includes parts of gap 314 created previously. In an embodiment, the selective removal of barrier layer 208 discussed previously and the selective removal of the liner layer 210 discussed herein are to a near identical depth. In an embodiment, the liner layer 210 may be removed using any known removal technique known in the art, such as, for example, wet etching, dry etching, reactive ion etching or any combination thereof.

Figure 5:
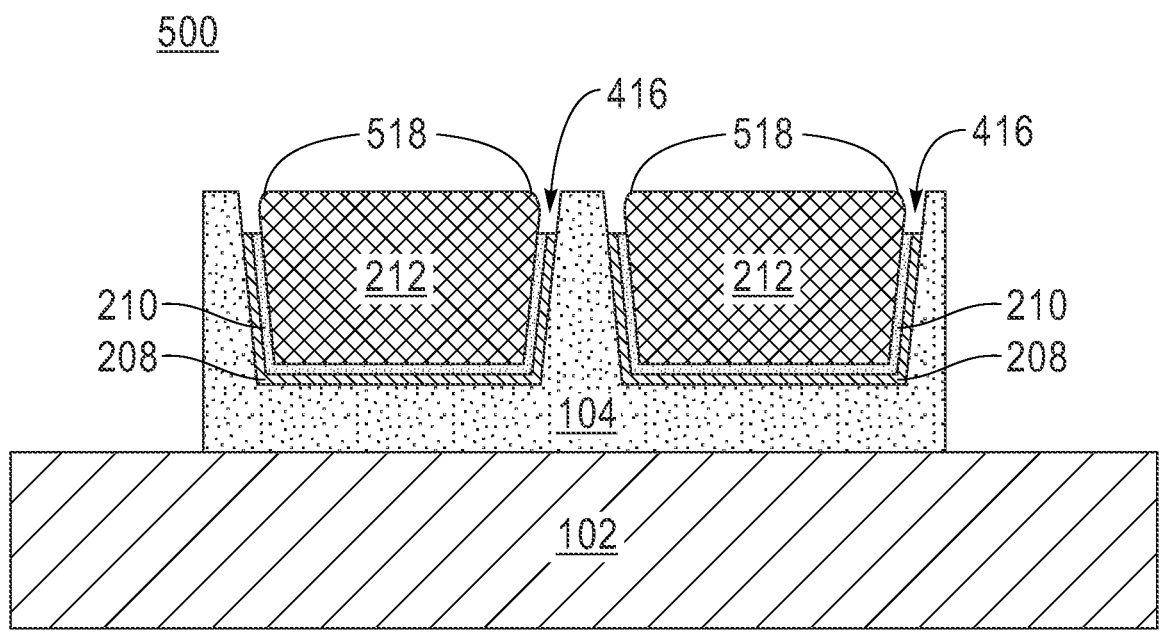
FIG. 5 depicts a cross-sectional view of the semiconductor structure rounding of the metal layer in accordance with a first embodiment of the present invention.

FIG. 5 depicts a cross-sectional view of the semiconductor structure 500 rounding 518 of the metal layer 212 in accordance with a first embodiment of the present invention. As depicted, FIG. 5 includes a metal layer 212 that is rounded 518 at each corner adjacent to gap 416. In other words, four corners are rounded 518. By rounding metal layer 212 this creates a larger T2T distance. In an embodiment, the metal layer 212 may be rounded 518 using any known removal technique known in the art, such as, for example, wet etching, reactive ion etching or any combination thereof. In an embodiment, these rounding 518 processes will reduce the overall height of metal layer 212, but corners will be etched much faster than the flat surface of the metal layer 212 due to high energy of corners.

Figure 6:
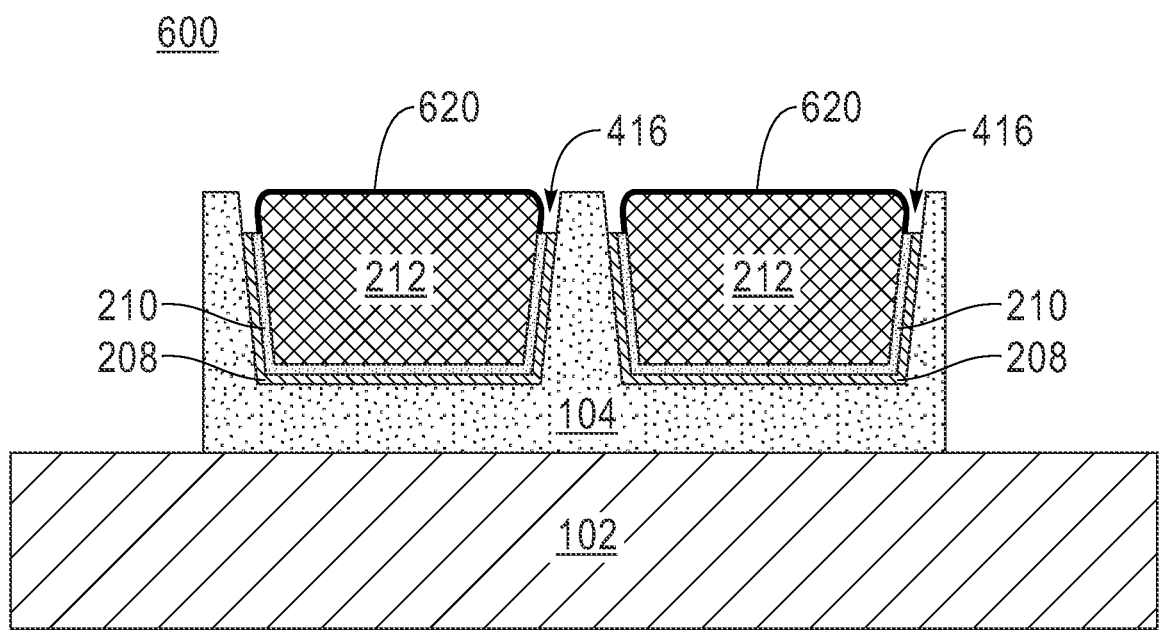
FIG. 6 depicts a cross-sectional view of the semiconductor structure after a metal liner is deposited over the exposed portions of the metal layer in accordance with a first embodiment of the present invention.

FIG. 6 depicts a cross-sectional view of the semiconductor structure 600 after a metal liner 620 is deposited over the exposed portions of the metal layer 212 in accordance with a first embodiment of the present invention. As depicted, FIG. 6 shows metal liner 620 is deposited upon the exposed portions of metal layer 212. In an embodiment, the metal liner 620 is deposited using sputtering, ECP, CVD, ALD, or any other process known in the art. In an embodiment, metal liner 620 is Co, Ru, or any other material known in the art. In an embodiment, metal liner 620 may range in thickness from 0.5 nm to 5 nm but is not limited to said thickness.

Figure 7:
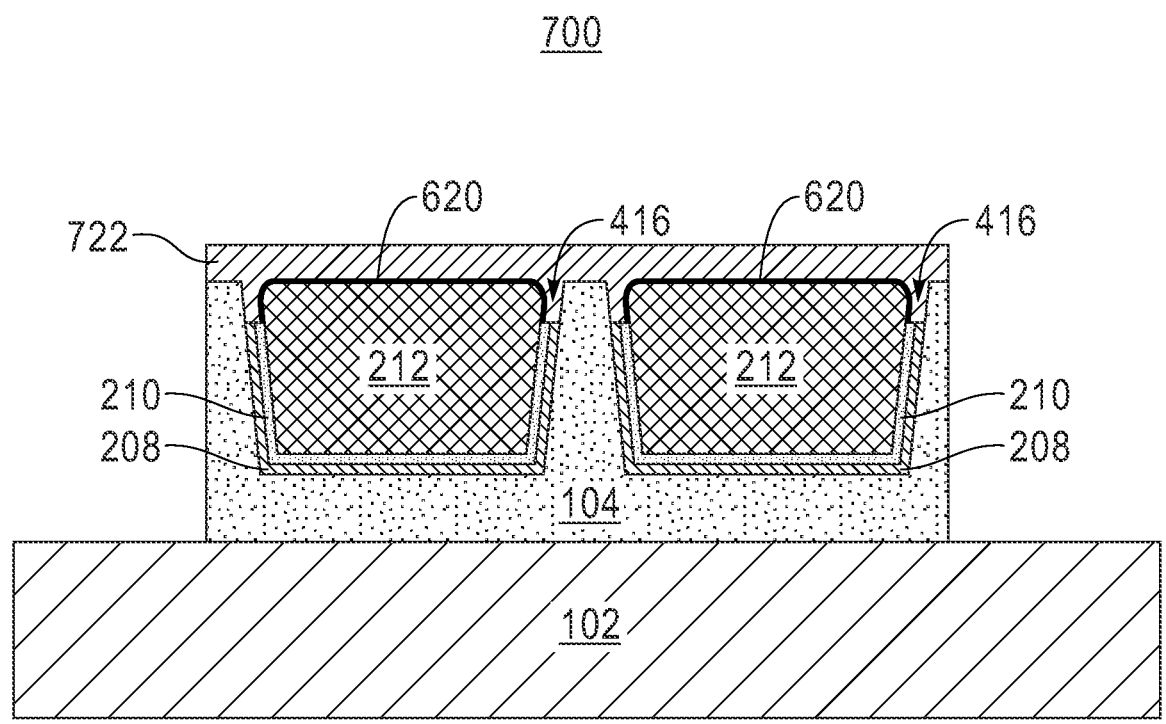
FIG. 7 depicts a cross-sectional view of the semiconductor structure after depositing a capping layer on top of the metal liner, liner layer, barrier layer, first low-k electric layer, and metal layer in accordance with a first embodiment of the present invention.

FIG. 7 depicts a cross-sectional view of the semiconductor structure 700 after depositing a capping layer 722 on top of the metal liner 620, liner layer 210, barrier layer 208, first low-k dielectric layer 104, and metal layer 212 in accordance with a first embodiment of the present invention. As depicted, FIG. 7 includes a capping layer 722 deposited on top of the metal liner 620, liner layer 210, barrier layer 208, first low-k electric layer 104, and metal layer 104 and then the capping layer 722 is planarized using any process known in the art. In an embodiment, the capping layer 722 is deposited using CVD, ALD, or any other process known in the art. In an embodiment, the capping layer 722 may be SiCN, or any other material known in the art. In an embodiment, the capping layer 722 may be in the thickness range of 3 nm to 30 nm but is not limited to said thickness. In a preferred embodiment, the capping layer 722 may be 10 nm. In an embodiment, the thickness range is measured from the metal layer 212.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure comprising:
    a dielectric layer on top of and in contact with a substrate;
    a conductive line located within the dielectric layer;
    a barrier layer on top of and in contact with the dielectric layer, wherein the barrier layer is below a liner layer;
    the liner layer on top of and in contact with the barrier layer and below and in contact with the conductive line;
    a metal liner on top of and in contact with the conductive line, wherein a portion of the metal liner contacts a sidewall of the conductive line; and
    a capping layer on top of and in contact with the dielectric layer, the barrier layer, the liner layer and the metal liner.

2. The semiconductor structure of claim 1, wherein the dielectric layer has a dielectric constant of less than 4.0.

3. The semiconductor structure of claim 1, wherein the capping layer has a thickness of 10 nm.

4. The semiconductor structure of claim 1, wherein the capping layer consists of SiCN.

5. The semiconductor structure of claim 1, wherein the conductive line has rounded corners.

6. The semiconductor structure of claim 1, wherein the barrier layer and the liner layer have a reduced height relative to the conductive line.

7. The semiconductor structure of claim 1, wherein the barrier layer and the liner layer have a same height.

8. The semiconductor structure of claim 1, wherein the dielectric layer has a dielectric constant of less than 3.5.

9. The semiconductor structure of claim 1, wherein the conductive line consists of Cu.

* * * * *